(12) United States Patent
Ahn

(10) Patent No.: US 7,202,157 B2
(45) Date of Patent: Apr. 10, 2007

(54) METHOD FOR FORMING METALLIC INTERCONNECTS IN SEMICONDUCTOR DEVICES

(75) Inventor: Yong Soo Ahn, Bucheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 303 days.

(21) Appl. No.: 11/026,756

(22) Filed: Dec. 30, 2004

(65) Prior Publication Data

US 2005/0142843 A1 Jun. 30, 2005

(30) Foreign Application Priority Data

Dec. 31, 2003 (KR) ............... 10-2003-0101053

(51) Int. Cl.
*H01L 21/4763* (2006.01)
*H01L 21/44* (2006.01)
*H01L 21/461* (2006.01)
*H01L 29/40* (2006.01)

(52) U.S. Cl. ............ 438/622; 438/623; 438/625; 438/627; 438/629; 438/631; 438/634; 438/643; 438/648; 438/653; 438/672; 438/675; 438/692; 438/740; 257/758; 257/759; 257/760

(58) Field of Classification Search ............... None
See application file for complete search history.

(56) References Cited

U.S. PATENT DOCUMENTS

| | | | |
|---|---|---|---|
| 5,913,141 A * | 6/1999 | Bothra .................. | 438/625 |
| 6,010,958 A * | 1/2000 | Chen et al. ............ | 438/626 |
| 6,300,683 B1 | 10/2001 | Nagasaka et al. ...... | 257/774 |
| 6,376,353 B1 * | 4/2002 | Zhou et al. ............ | 438/612 |
| 6,404,055 B1 | 6/2002 | Jeon et al. ............. | 257/752 |
| 6,821,877 B1 | 11/2004 | Han ....................... | 438/612 |
| 7,056,826 B2 * | 6/2006 | Wu et al. ............... | 438/627 |
| 7,087,517 B2 * | 8/2006 | Andreyushchenko et al. | 438/627 |
| 7,132,363 B2 * | 11/2006 | Yang et al. ............. | 438/639 |
| 2004/0067643 A1 * | 4/2004 | Liu et al. ............... | 438/687 |
| 2004/0119163 A1 * | 6/2004 | Wong et al. ........... | 257/758 |
| 2004/0137719 A1 * | 7/2004 | Jin ......................... | 438/637 |
| 2004/0140564 A1 * | 7/2004 | Lee et al. .............. | 257/758 |

* cited by examiner

*Primary Examiner*—Carl Whitehead, Jr.
*Assistant Examiner*—James M. Mitchell
(74) *Attorney, Agent, or Firm*—Saliwanchik, Lloyd & Saliwanchik

(57) ABSTRACT

A method for forming a metallic interconnect in a semiconductor device is disclosed. An example method forms an IDL on a substrate including predetermined devices, forms a via hole in the IDL, depositing a first metal diffusion preventive layer and a metal layer to form a via plug on the IDL, and performs a planarization process using the first metal diffusion preventive layer using as an etching stop layer. In addition, the example method forms a metallic interconnect on the first metal diffusion preventive layer, deposits the other metal diffusion preventive layer on the metallic interconnect, and etches a predetermined part of first and second metal diffusion preventive layers and the metallic interconnect using a mask pattern.

6 Claims, 4 Drawing Sheets

METHOD FOR FORMING METALLIC INTERCONNECTS IN SEMICONDUCTOR DEVICES

RELATED APPLICATION

This application claims the benefit of Korean Application No. Serial Number 10-2003-0101053, filed on Dec. 31, 2003, which is hereby incorporated herein by reference in its entirety.

TECHNICAL FIELD

The present disclosure relates to a semiconductor device and, more particularly, to a method to a method for forming a metallic interconnect in a semiconductor device.

BACKGROUND

FIGS. 1a through 1e are cross-sectional views illustrating a known metallic interconnect fabrication method. Referring to FIG. 1a, a conductive material is filled into a via hole. In particular, an interlayer dielectric layer (hereinafter referred to as "IDL") 1 is formed on a semiconductor substrate (not shown) having predetermined devices. A photoresist pattern for making a via hole is formed on the IDL 1 through a photoresist development process. Subsequently, a via hole is formed by etching the IDL 1. A preventive layer 2 is formed to protect the via hole from the diffusion of the metal. Preferably, the preventive layer comprises two layers, namely, a first layer and a second layer. In detail, the first layer comprising Ti is deposited as a liner layer by a sputtering process. Subsequently, the second layer comprising TiN is formed by a high pressure chemical vapor deposition (hereinafter referred to as "HPCVD") process. A first conductive layer 3 to form a via plug is then deposited on the preventive layer of the resulting structure. Preferably, the first conductive layer to form the via plug is deposited by a chemical vapor deposition (hereinafter referred to as "CVD") process and is made of tungsten.

Referring to FIG. 1b, the first conductive layer to form the via plug is removed by a planarization process such as a chemical mechanical polishing (hereinafter referred to as "CMP") process using the IDL 1 as an etching stop layer.

Referring to FIG. 1c, a first preventive layer 4 is formed on the entire surface of the resulting structure. The first preventive layer 4 is preferably made of Ti/TiN by a sputtering process. Subsequently, a second conductive layer 5 to form a metallic interconnect is then deposited on the first preventive layer 4 by a sputtering process. A second conductive layer 5 to form the metallic interconnect is preferably made of Al. A second preventive layer 6 is then formed on the second conductive layer 5 by the sputtering process. The second preventive layer 6 is preferably made of an identical material used for the first preventive layer 4. The first and second preventive layers 4 and 6 prevent the penetration and the diffusion of the metal to form the metallic interconnect into other parts such as the IDL 1.

Referring to FIG. 1d, a photoresist pattern for making a desired metallic interconnect is formed on the second preventive layer 6. The metallic interconnect is then formed by etching the predetermined part of the first and second preventive layers 4 and 6 and the second conductive layer 5 using the IDL 1 as the etching stop layer.

According to the known method described above, the planarization process is performed using the IDL 1 as the etching stop layer, thereby causing several problems. One problem is that the protective layer made of Ti/TiN is also removed during the planarization process. Thus, another preventive layer (i.e., the first preventive layer) between the via hole and the metallic interconnect has to be formed, thereby increasing the contact resistance of the metallic interconnect.

FIG. 1e is an enlarged-view of a circle 8 in FIG. 1d. Referring to FIG. 1e, a later thermal treatment generates TiAl3 layers on both the upper and the bottom of the metallic interconnect. The TiAl3 layers result from the reaction of Ti in the first and second preventive layers and Al in the metallic interconnect. The TiAl3 layers lead to increase the resistance of the metallic interconnect, therefore increasing the RC-delay of the semiconductor device.

DETAILED DESCRIPTION

Figure 1A:
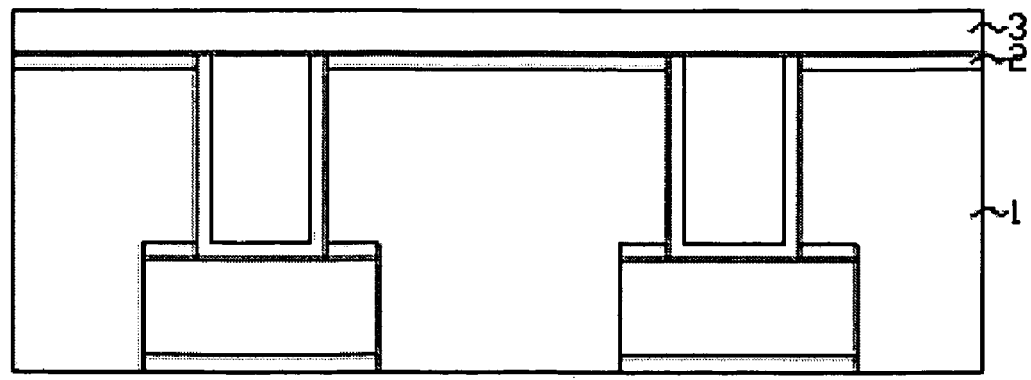
FIGS. 1a through 1e are cross-sectional views illustrating a known metallic interconnect fabrication method.
Figure 1B:
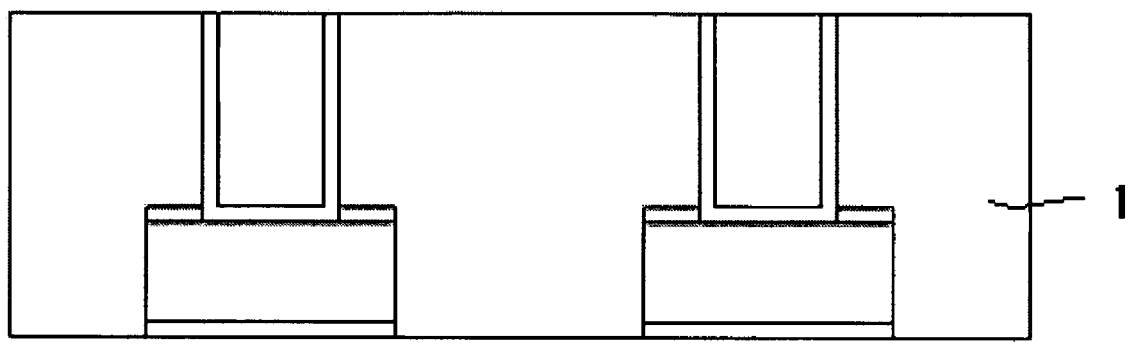
Figure 1C:
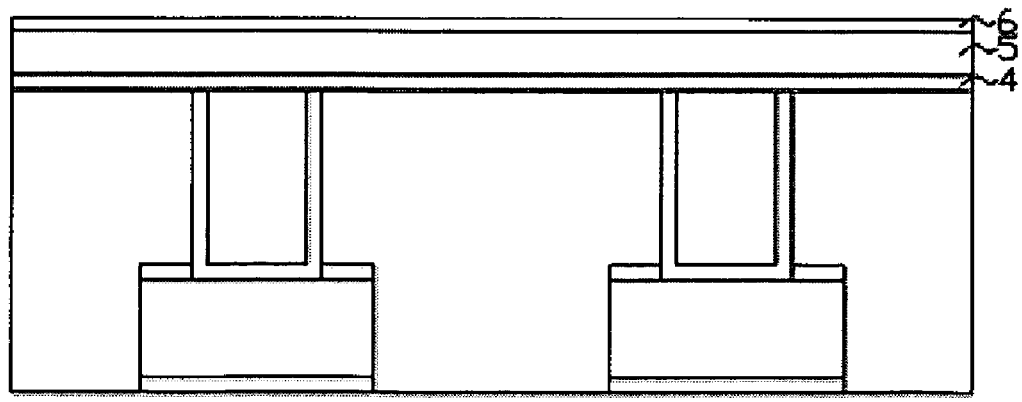
Figure 1D:
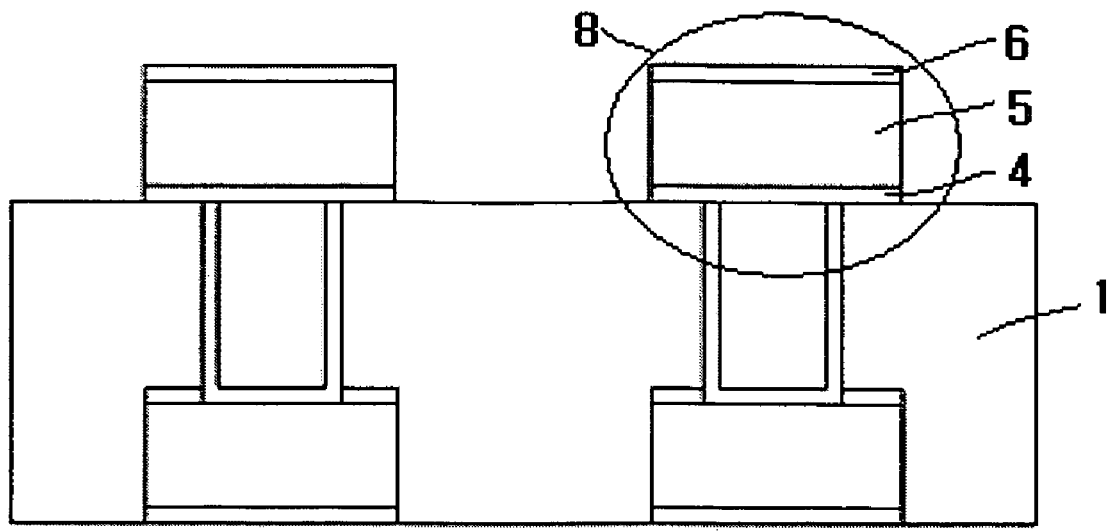
Figure 1E:
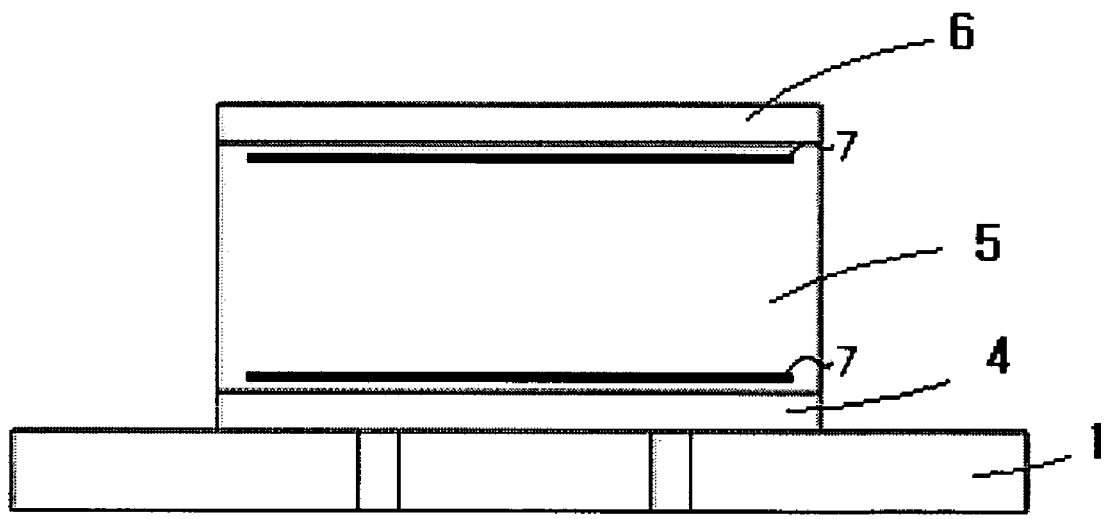
Figure 2A:
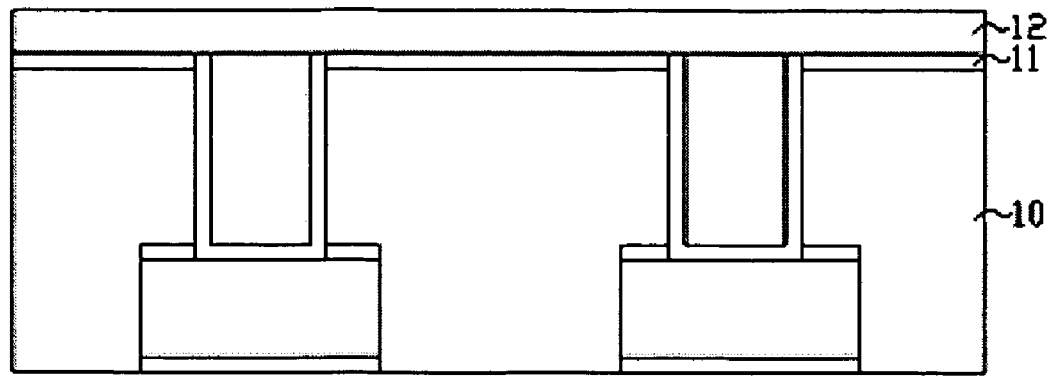
FIGS. 2a through 2e are cross-sectional views illustrating an example metallic interconnect fabrication method.

FIGS. 2a through 2e are cross sectional views illustrating an example metallic interconnect fabrication method. Referring to FIG. 2a, an IDL 10 is formed on a semiconductor substrate (not shown) having predetermined devices. A photoresist pattern for making a via hole is formed on the IDL 10 through a photoresist development process. Subsequently, a via hole is formed by etching the IDL 10. An MDPLV 11 is formed to protect the via hole from the diffusion or the penetration of metal. Preferably, the MDPLV 11 comprises two layers, namely, a first layer and a second layer. In particular, the first layer comprising Ti, in advance, is deposited as an liner layer by a sputtering process. Subsequently, the second layer comprising TiN is formed by an HPCVD process. A first conductive metal layer 12 to form a via plug is then deposited on the MDPLV 11. Preferably, the first conductive metal layer 12 to form the via plug is deposited by a CVD process and is made of tungsten.

Figure 2B:
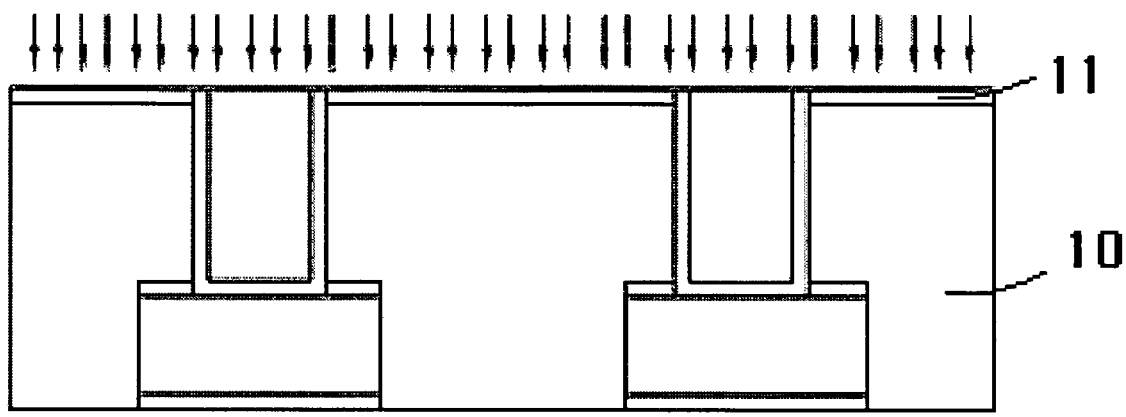

Referring to FIG. 2b, the first conductive metal layer is removed by a planarization process such as a CMP process using the MDPLV 11 as an etching stop layer. In the method of prior arts, because the IDL 10 is used as the etching stop layer, the MDPLV 11 has to be removed. However, according to the example method depicted in FIG. 2, the MDPLV 11 still remains after the CMP process, functioning as an MDPLI (not shown in FIG. 1).

Figure 2C:
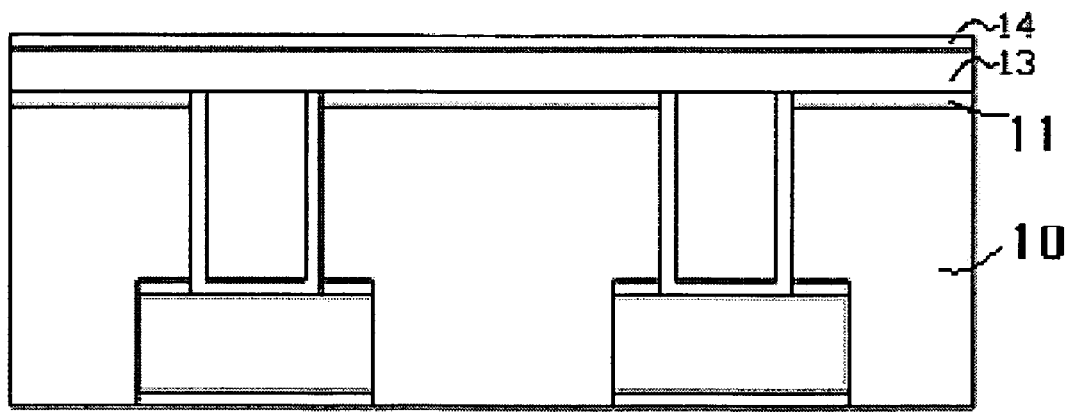

Referring to FIG. 2c, a second conductive metal layer 13 to form a metallic interconnect is then deposited on the entire surface of the MDPLV 11 by the sputtering process. The second conductive metal layer 13 to form the metallic interconnect is preferably made of Al. An MDPLI 14 is then formed on the second conductive metal layer 13 by the sputtering process. The MDPLI 14 preferably comprises an identical material used for the MDPLV 11. Accordingly, a process for forming another preventive layer (i.e., the first preventive layer in known devices) is omitted, thereby achieving the simplification of the fabrication process.

Figure 2D:
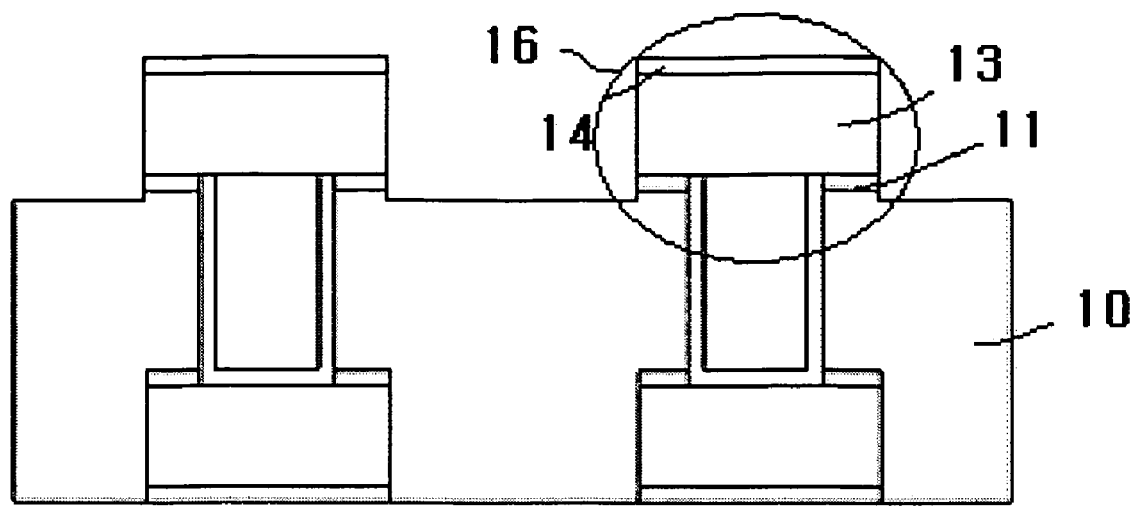

Referring to FIG. 2d, a photoresist pattern for making a desired metallic interconnect is formed on the MDPLI 14 by a conventional photolithography process. The metallic interconnect is then formed by etching the predetermined part of the MDPLI 14 and the second conductive metal layer 13. The MDPLV 11 remaining on the predetermined part of the IDL 10 is simultaneously removed while the predetermined part of the IDL 10 is over-etched.

Figure 2E:
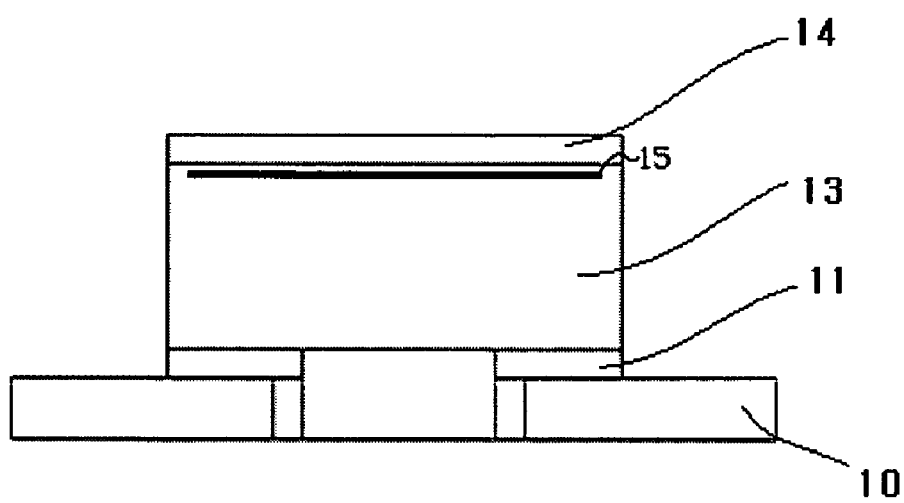

FIG. 2e is an enlarged-view of a circle 16 in FIG. 2d. Referring to FIG. 2e, only one TiAl3 layer 15 is formed on the upper part of the metallic interconnect through a later thermal treatment, thereby decreasing the RC-delay of the semiconductor device. The TiAl3 layer 15 results from the reaction of Ti in the MDPLI 14 and Al in the metallic interconnect.

Accordingly, the example method described herein simplifies the metallic interconnect fabrication process interconnect by employing an MDPLV as an MDPLI. Moreover, in comparison to known devices where the electric current flows from the via hole to the metal diffusion preventive layer and the metallic interconnect, electric current, in the examples described herein, flows directly from the via hole to the metallic interconnect. Therefore, the contact resistance is greatly reduced. Furthermore, the area of the TiAl3 layer is smaller than that of known devices, decreasing the resistance of the metallic interconnect. As a result, the metallic interconnect fabrication method described herein reduces costs by reducing the fabrication cost and enhances the electric characteristics by reducing RC-delay.

While the examples herein have been described in detail with reference to example embodiments, it is to be understood that the coverage of this patent is not limited to the disclosed embodiments, but, on the contrary, is intended to cover various modifications and equivalent arrangements included within the spirit and scope of the appended claims.

What is claimed is:

1. A method for forming a metallic interconnect, comprising:

(a) forming an IDL on a substrate including predetermined devices;

(b) forming a via hole in the IDL, depositing a first metal diffusion preventive layer and a metal layer to form a via plug on the IDL;

(c) performing a planarization process using the first metal diffusion preventive layer using as an etching stop layer;

(d) forming a metallic interconnect on the first metal diffusion preventive layer and depositing the other metal diffusion preventive layer on the metallic interconnect; and (e) etching a predetermined part of first and second metal diffusion preventive layers and the metallic interconnect using a mask pattern.

2. A method as defined by claim 1, wherein each of the first and second metal diffusion preventive layers comprises one layer made of Ti and another layer made of TiN.

3. A method as defined by claim 1, wherein the metal layer to form the via plug is made of tungsten.

4. A method as defined by claim 1, wherein the metallic interconnect is made of Al.

5. A method as defined by claim 1, wherein in operation (e), the first metal diffusion preventive layer remaining on the predetermined part of the IDL is simultaneously removed while the predetermined part of the IDL is over-etched.

6. A method as defined by claim 1, wherein the via plug is directly in contact with the metallic interconnect.

* * * * *